(12) United States Patent
Wu

(10) Patent No.: US 8,174,867 B2
(45) Date of Patent: May 8, 2012

(54) NEGATIVE-VOLTAGE GENERATOR WITH POWER TRACKING FOR IMPROVED SRAM WRITE ABILITY

(75) Inventor: Jui-Jen Wu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 364 days.

(21) Appl. No.: 12/617,437

(22) Filed: Nov. 12, 2009

(65) Prior Publication Data
US 2010/0182865 A1    Jul. 22, 2010

Related U.S. Application Data

(60) Provisional application No. 61/146,568, filed on Jan. 22, 2009.

(51) Int. Cl.
*G11C 11/00* (2006.01)

(52) U.S. Cl. ............... 365/154; 365/189.09; 365/226

(58) Field of Classification Search .................. 365/154, 365/189.09, 226
See application file for complete search history.

(56) References Cited

U.S. PATENT DOCUMENTS

| 5,726,944 A | 3/1998 | Pelley, III et al. |
| 2008/0130380 A1* | 6/2008 | Wang et al. ............ 365/189.16 |

* cited by examiner

*Primary Examiner* — Hoai V Ho
(74) *Attorney, Agent, or Firm* — Slater & Matsil, L.L.P.

(57) ABSTRACT

An integrated circuit structure includes a static random access memory (SRAM) cell; a first power supply node connected to the SRAM cell, wherein the first power supply node is configured to provide a first positive power supply voltage to the SRAM cell; and a bit-line connected to the SRAM cell. A negative-voltage generator is coupled to, and configured to output a negative voltage to, the bit-line, wherein the negative-voltage generator is so configured that the negative voltage decreases in response to a decrease in the first positive power supply voltage and increases in response to an increase in the first positive supply voltage.

18 Claims, 5 Drawing Sheets

NEGATIVE-VOLTAGE GENERATOR WITH POWER TRACKING FOR IMPROVED SRAM WRITE ABILITY

This application claims priority to U.S. Provisional Patent Application Ser. No. 61/146,568, filed Jan. 22, 2009, and entitled, "Negative-Voltage Generator with Power Tracking for Improved SRAM Write Ability," which application is hereby incorporated herein by reference.

TECHNICAL FIELD

This invention relates generally to integrated circuits, and more particularly to static random access memories (SRAMs), and even more particularly to methods and circuits for write operations of the SRAMs.

BACKGROUND

Static random access memory (SRAM) is commonly used in integrated circuits. SRAM cells have the advantageous feature of holding data without a need for refreshing. SRAM cells may include different numbers of transistors and are often accordingly referred to by the number of transistors, for example, six-transistor (6-T) SRAM, eight-transistor (8-T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into, or read a bit from, the SRAM cell.

With the increasing down-scaling of integrated circuits, the power supply voltages of the integrated circuits are reduced, along with the power supply voltages of memory circuits. Accordingly, read and write margins of the SRAM cells, which are used to indicate how reliably the bits of the SRAM cells can be read from and written into, are reduced. Due to the existence of static noise, the reduced read and write margins may cause errors in the respective read and write operations.

Various approaches have been explored to lower VCCmin, which is the minimum power supply voltage VCC required for reliable read and write operations, and to suit the ever-decreasing power supply voltages. For example, a negative bit-line technique was used to improve cell write-ability at low power supply voltages, particularly when the word-line voltage is suppressed. Referring to FIG. 1, which is a 6-T SRAM cell connected to negative-voltage generator 120. Assuming a "0" bit is to be written into illustrated SRAM cell 100, bit-line BL hence carries a low voltage representing a logic low, and bit-line BLB carriers a high voltage representing a logic high. Before the write operation, node 110 is at a high voltage, while node 112 is at a low voltage. To write a "0" bit into the SRAM cell, a negative voltage, for example, −100 mV, is put on bit-line BL. The negative voltage causes an increase in the voltage difference between node 110 and bit-line BL. Accordingly, the write operation becomes easier, and VCCmin is reduced.

The negative bit-line technique, however, comes with a price. As shown in FIG. 2, the negative voltage as illustrated is generated using negative-voltage generator 120, as shown in FIG. 1, which includes a charge pump receiving power supply voltage VDD and generating the negative voltage. FIG. 2 schematically illustrates the relationship between power supply voltage VDD and the negative bit-line voltage generated by negative-voltage generator 120. It is noted that if power supply voltage VDD becomes lower, the magnitude of the negative voltage also reduces. This trend, however, defeats the purpose of having the negative bit-line voltage. As is well perceived, if power supply voltage VDD is reduced, the magnitude of the negative bit-line voltage needs to be greater in order to offset the reduction in power supply voltage VDD. To generate a lower negative voltage, the capacitor in negative-voltage generator 120 needs to be larger, and hence requires a greater chip area. A new negative-voltage generator is thus needed to solve the above-discussed problem.

SUMMARY OF THE INVENTION

In accordance with one aspect of the present invention, an integrated circuit structure includes a static random access memory (SRAM) cell; a first power supply node connected to the SRAM cell, wherein the first power supply node is configured to provide a first positive power supply voltage to the SRAM cell; and a bit-line connected to the SRAM cell. A negative-voltage generator is coupled to, and configured to output a negative voltage to, the bit-line, wherein the negative-voltage generator is so configured that the negative voltage decreases in response to a decrease in the first positive power supply voltage, and increases in response to an increase in the first positive power supply voltage.

In accordance with another aspect of the present invention, an integrated circuit structure includes a negative-voltage node; a capacitor including a first capacitor plate connected to the negative-voltage node; an inverter; a supply voltage regulator; and a high-voltage power source. The inverter includes a first output node coupled to a second capacitor plate of the capacitor; and a first power-receiving node. The supply voltage regulator includes a second output node coupled to the first power-receiving node; a second input node receiving an input signal having a first maximum positive voltage, wherein the supply voltage regulator is configured to convert the input signal to a regulated voltage; and a second power-receiving node. The supply voltage regulator is configured so that the regulated voltage increases in response to a decrease in the first maximum positive voltage, and decreases in response to an increase in the first maximum positive voltage. The high-voltage power source is coupled to the second power-receiving node and is configured to supply a high voltage higher than the first maximum positive voltage.

In accordance with yet another aspect of the present invention, an integrated circuit structure includes a SRAM cell; a first power supply node connected to the SRAM cell, wherein the first power supply node is configured to supply a first positive power supply voltage to the SRAM cell; a bit-line connected to the SRAM cell; a capacitor including a first capacitor plate coupled to the bit-line. A first inverter includes a first output coupled to a second capacitor plate of the capacitor; and a first power-receiving node. The integrated circuit structure further includes a supply voltage regulator including a second inverter, which includes a second output coupled to the first power-receiving node and outputs a regulated voltage; and a second power-receiving node configured to receive a high supply voltage higher than the first positive power supply voltage.

The advantageous features of the present invention include generating negative voltages reflecting the need of write operations, hence the improved reliability in the write operations.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

A novel negative-voltage generator embodiment for generating negative voltages in write operations of static random access memory (SRAM) cells is provided. The variations of the embodiment are discussed. Throughout the various views and illustrative embodiments of the present invention, like reference numbers are used to designate like elements.

Figure 1:
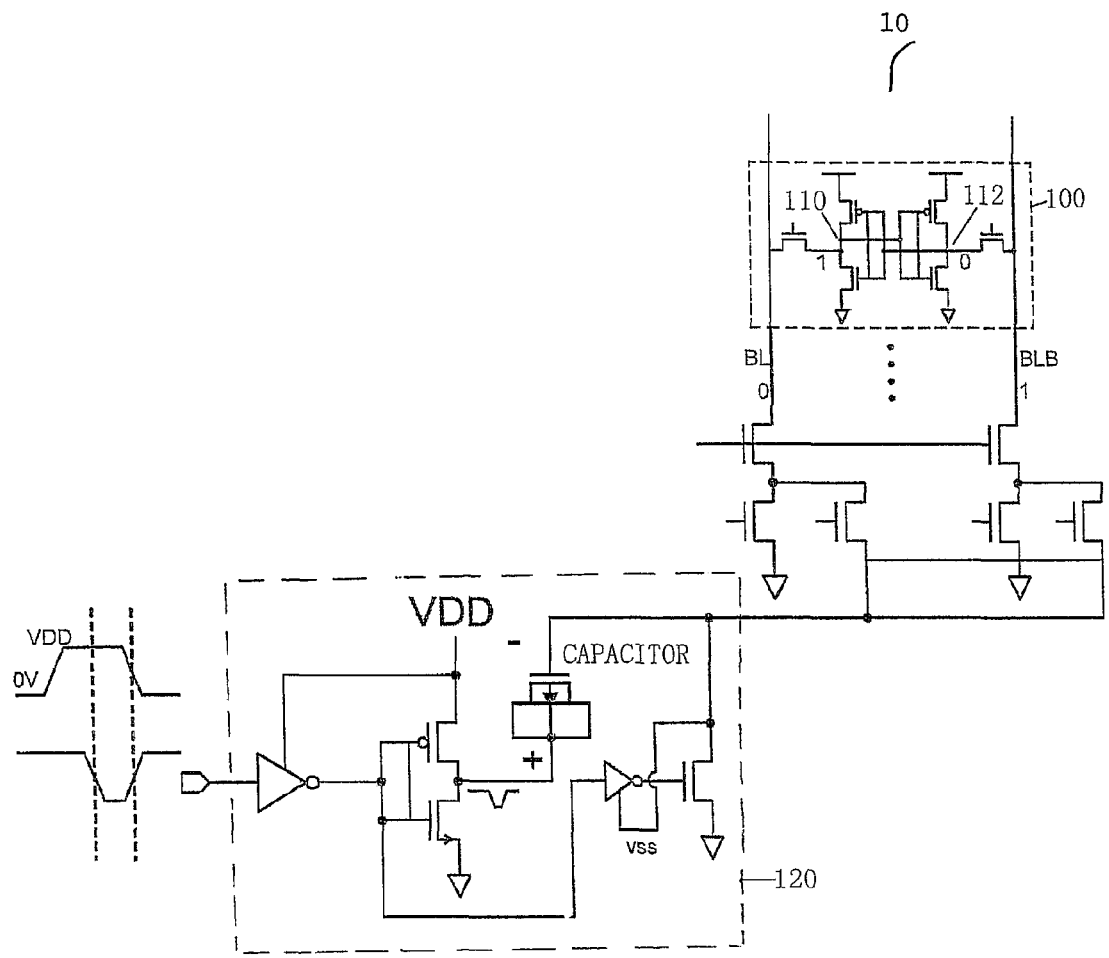
FIG. 1 illustrates a conventional static random access memory (SRAM) including a SRAM cell and a charge pump for supplying a negative voltage to the SRAM cell.
Figure 2:
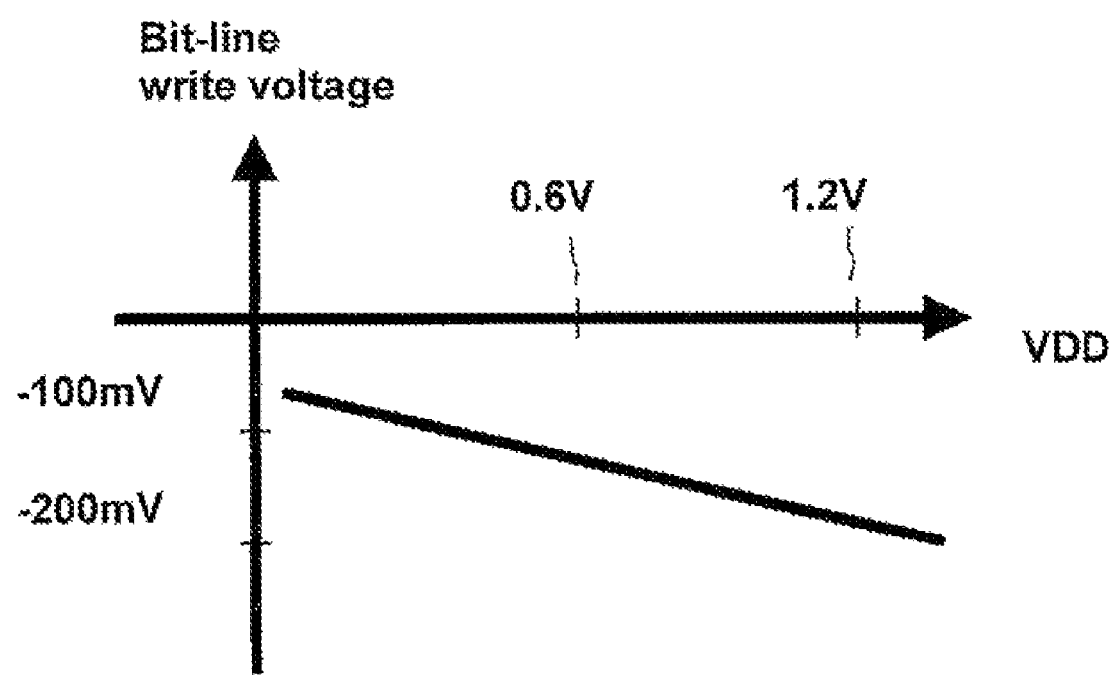
FIG. 2 illustrates the relationship between power supply voltage VDD and the negative bit-line voltage generated by the conventional charge pump.
Figure 3:
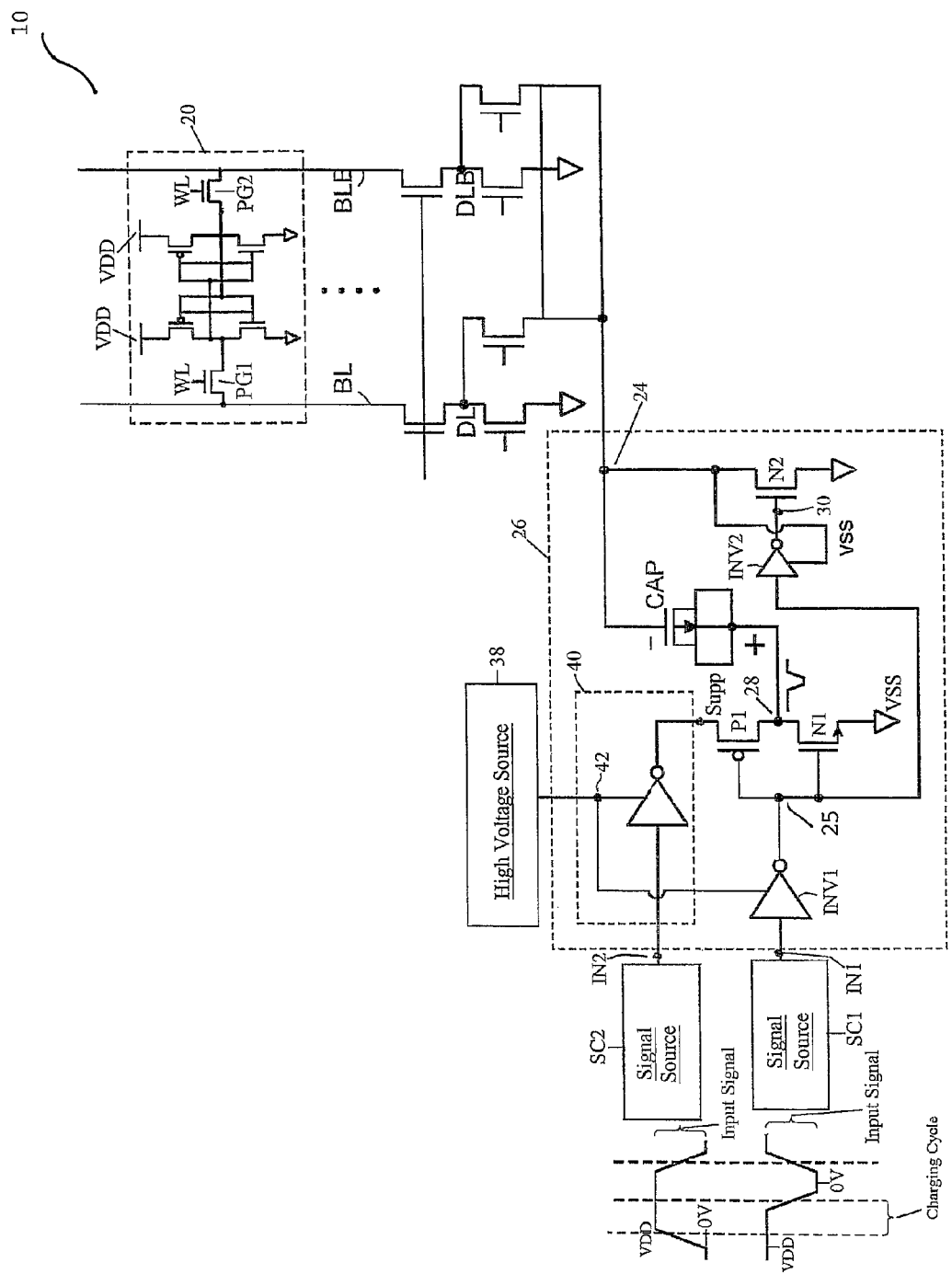
FIG. 3 illustrates an embodiment of the present invention.

Referring to FIG. 3, SRAM 10 is provided. SRAM 10 includes a plurality of SRAM cells arranged in rows and columns. Word-lines (not shown) are arranged in the row direction with each of the word-lines connected to SRAM cells in a same row. Bit-lines are arranged in the column direction with each pair of complementary bit-lines connected to SRAM cells in a same column. For simplicity, FIG. 3 only illustrates SRAM cell 20, which comprises six transistors, including pass-gate transistors PG1 and PG2 connected to complementary bit-lines BL and BLB, respectively. Bit-lines BL and BLB are further coupled to data-lines DL and DLB, respectively, and are coupled to negative-voltage node 24. SRAM cell 20 may be supplied by positive power supply voltage VDD.

Negative-voltage generator 26 generates the negative voltage at negative-voltage node 24. Negative-voltage generator 26 includes inverter INV1 and the inverter formed of PMOS transistor P1 and NMOS transistor N1. The drains of PMOS transistor P1 and NMOS transistor N1 are connected to capacitor CAP, which may be formed of a PMOS transistor with its source and drain interconnected to form one capacitor plate, and a gate acting as the other capacitor plate. Node IN1 receives a first input signal, which is supplied by signal source SC1. The input signal at node IN1 includes a high voltage level (referred to as a maximum positive voltage hereinafter), which may be at the same level as power supply voltage VDD provided to SRAM cell 20. The input signal further includes low pulses at low voltages, which may be voltage VSS, for example, the electrical ground. An exemplary input signal is drawn to the left of signal source SC1. When the voltage at node IN1 is VDD, node 25 is at a low voltage, for example, voltage VSS, and node 28 is at voltage VDD. For the simplicity of discussion, the voltage drops caused by the threshold voltages of transistors are not taken into account. At this time, node 30 is at voltage VDD, and hence NMOS transistor N2 (which acts as a switch) is turned on, so that negative-voltage node 24 is coupled to VSS (or ground) through NMOS transistor N2. Capacitor CAP is thus charged by voltage VDD, with node 28 having voltage VDD at node 28.

During a write operation of SRAM cell 20, the voltage at node IN1 changes to VSS, NMOS transistor N2 is turned off since the voltage at node 30 becomes VSS. On the other hand, node 28 is at voltage VSS. Accordingly, negative-voltage node 24 is at a negative voltage since the previous charging of capacitor CAP causes node 24 to have a lower voltage than node 28. Capacitor CAP shares charges with SRAM cell 20 and the devices between SRAM cell 20 and node 24, and the resulting negative voltage at node 24 is related to the charge-sharing result. When the voltage at node 24 becomes negative, the negative voltage is supplied to the VSS node of inverter INV2 so that the voltage at node 30 is further lowered, and NMOS transistor N2 is turned off more thoroughly.

Preferably, when power supply voltage VDD of SRAM cell 20 fluctuates and becomes lower, the negative voltage supplied by negative-voltage generator 26 is preferably reduced (with a greater absolute value), or in other words, becomes more negative. Conversely, when supply voltage VDD of SRAM cell 20 fluctuates and becomes higher, the negative voltage supplied by negative-voltage generator 26 is preferably increased (with a greater absolute value). In other words, the negative voltage preferably tracks the movement of voltage VDD to keep a substantially stable voltage difference between voltage VDD and the negative voltage. Such a stable voltage difference will advantageously improve the write ability of the SRAM cells without causing erroneous operations. In the embodiments of the present invention, node SUPP, which supplies the voltage for charging capacitor CAP, is regulated to achieve the above-discussed goal.

In an embodiment of the present invention, supply voltage regulator 40 is provided, and has an output connected to node SUPP. Supply voltage regulator 40 is powered with high supply voltage HV (at node 42) that is higher than power supply voltage VDD. Preferably, high supply voltage HV is a constant voltage independent from the drift of voltage VDD and is provided by high-voltage source 38. It is realized that the optimum high supply voltage HV is related to the capacitance of capacitor CAP, and the greater the capacitance is, the lower the high supply voltage HV is required, and vice versa. Accordingly, by increasing high supply voltage HV, the chip area occupied by capacitor CAP may be reduced. Supply voltage regulator 40 includes input IN2 connected to signal source SC2, which is configured to output a voltage varying between a maximum positive voltage equal to voltage VDD and a low voltage VSS. It is noted that the maximum positive voltage of the signal provided by signal source SC2 also varies if power supply voltage VDD of SRAM cell 20 varies. In an exemplary embodiment, the input signal received at node IN2 is a word-line signal, which may be the same word-line signal provided to word-line WL connected to SRAM cell 20. Accordingly, signal source SC2 may be a local controller. An exemplary input signal at node IN2 is drawn to the left of signal source SC2.

Figure 4:
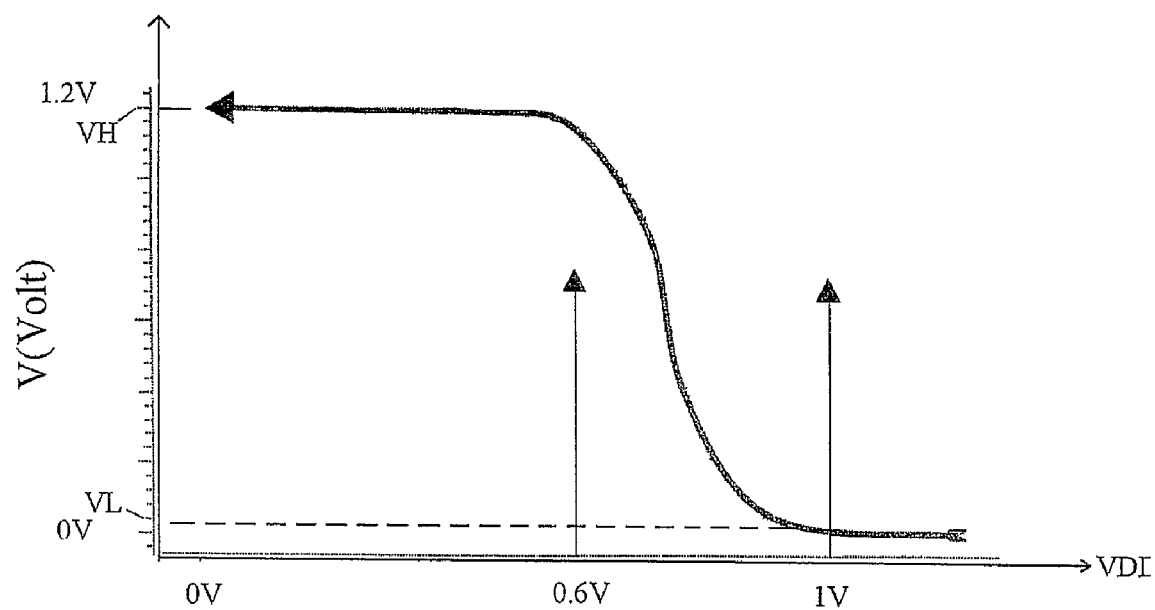
FIG. 4 illustrates a transfer curve of a supply voltage regulator in the embodiments of the present invention.

Supply voltage regulator 40 preferably has the transfer curve as shown in FIG. 4. The X-axis indicates the voltage of the input signal received at input IN2, which is equal to or lower than voltage VDD. The Y-axis indicates regulated voltage at node SUPP. Preferably, maximum voltage VH (for example, 1.2V) that can be outputted by supply voltage regulator 40 (when voltage VDD itself is low) is higher than voltage VDD, for example, 1V. Further, in an exemplary embodiment, supply voltage regulator 40 is so designed that if power supply voltage VDD is less than a certain percentage, for example, about 60 percent of the designed value, the output voltage is close to maximum voltage VH, while if power supply voltage VDD is greater than about 80 (or 90) percent of the designed value, the out put voltage is close to the ground voltage, or equal to the threshold voltage of an internal transistor inside supply voltage regulator 40 (for example, transistor N3 in FIG. 5).

In the preferred embodiment, as shown in FIG. 4, when voltage VDD is relatively high, the regulated voltage at node SUPP is low. Accordingly, during the charging cycle as shown in the left corner of FIG. 3, the voltage difference applied on the plates of capacitor CAP is low and a small amount of charges are charged to capacitor CAP. When the signal at node IN 1 flips to a low pulse, the resulting negative voltage at node 24 is high (with a smaller absolute value, or in other words, less negative). Conversely, when voltage VDD is relatively low, in the charging cycle, the regulated voltage at node SUPP is high. Accordingly, the voltage difference applied on the plates of capacitor CAP is high and a greater amount of charges are charged to capacitor CAP. When the signal at node IN1 flips to a low pulse, the resulting negative voltage at node 24 is also low (with a greater absolute value, or in other words, more negative). Such behavior of the negative voltage fits the need for write operations of SRAM cell 20.

Referring to FIG. 4 again, in an exemplary embodiment, the regulated voltage VL at node SUPP (FIG. 3) is close to 0V when supply voltage VDD is 1V or higher. In this case, supply voltage VDD is great enough for reliable write operations. Advantageous, substantially no negative voltage is generated. If, however, supply voltage VDD drifts to about 0.6V or lower, which is too low for the write operations, the regulated voltage at node SUPP is close to about 1.2V, and hence a negative voltage with a greater amplitude is generated and provided to bit-line BL (or bit-line BLB).

Figure 5:
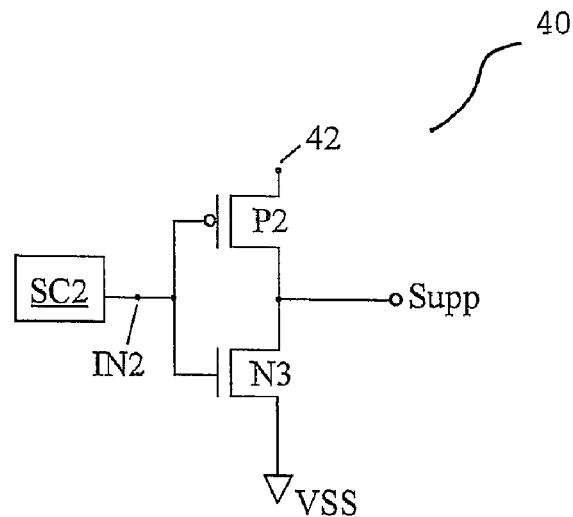
FIG. 5 illustrates an exemplary supply voltage regulator.

FIG. 5 illustrates an exemplary supply voltage regulator 40, which is simply an inverter. The drains of the PMOS transistor P2 and NMOS transistor N3 are connected to node SUPP, which is also shown in FIG. 3. The gates of PMOS transistor P2 and NMOS transistor N3 are connected to input IN2 (refer to FIG. 3). The threshold voltages of PMOS transistor P2 and NMOS transistor N3 may be customized to generate the desirable transfer curve as shown in FIG. 4.

Figure 6:
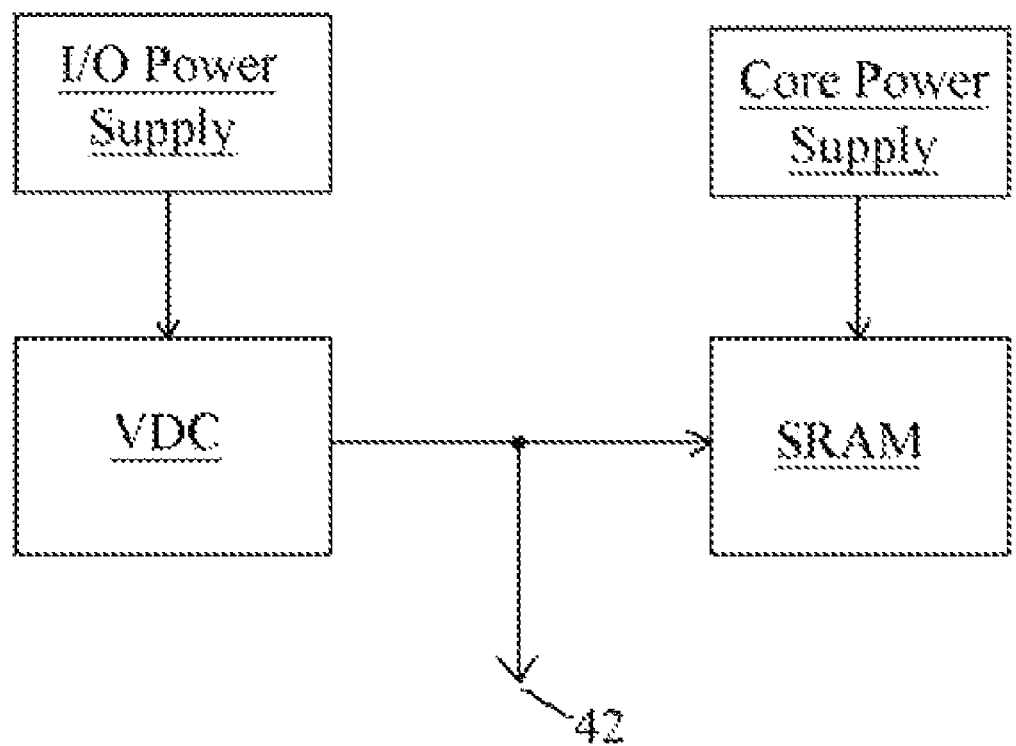
FIG. 6 illustrates exemplary circuits for generating power supply voltage VDD and the high voltage provided to the supply voltage regulator.

A semiconductor chip may include a dual power, with a higher voltage (I/O supply voltage) for an I/O circuit, and a lower voltage (core supply voltage) from a core power supply for a SRAM cell and a core circuit. Referring to FIG. 6, the high voltage HV supplied to node 42 in FIG. 3 may be generated by a voltage down converter (VDC), which receives the I/O supply voltage (for example, between about 1.8V and 2.5V) from an I/O power supply, and generates the high supply voltage HV that is lower than the I/O supply voltage, but higher than voltage VDD. In this case, high-voltage source 38, as shown in FIG. 3, may be the VDC as shown in FIG. 6.

The embodiments of the present invention have several advantageous features. First, since high voltage HV is used to charge capacitor CAP, capacitor CAP may be made smaller without causing the reduction in the amplitude of the negative voltage. The negative voltage tracks the variation of power supply voltage VDD, and hence the write operations are more reliable and are substantially immune to the variation of power supply voltage VDD.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a static random access memory (SRAM) cell;
    a first power supply node connected to the SRAM cell, wherein the first power supply node is configured to provide a first positive power supply voltage to the SRAM cell;
    a bit-line connected to the SRAM cell;
    a negative-voltage generator coupled to, and configured to output a negative voltage to, the bit-line, wherein the negative-voltage generator is configured so that the negative voltage decreases in response to a decrease in the first positive power supply voltage, and increases in response to an increase in the first positive supply voltage; and
    a high-voltage source coupled to the negative-voltage generator, wherein the high-voltage source is configured to output a second positive power supply voltage higher than the first positive power supply voltage.

2. The integrated circuit structure of claim 1, wherein the second positive power supply voltage is a substantially constant voltage independent from a variation in the first power supply voltage.

3. The integrated circuit structure of claim 1 further comprising:
    a capacitor comprising a first capacitor plate coupled to the bit-line;
    an inverter comprising an output coupled to a second capacitor plate of the capacitor; and
    a supply voltage regulator configured to receive the second positive power supply voltage and an input signal having a maximum value equal to the first positive power supply voltage, and generating a regulated voltage as a power supply of the inverter, wherein the regulated voltage increases in response to a decrease in the first positive power supply voltage and decreases in response to an increase in the first positive power supply voltage.

4. The integrated circuit structure of claim 3, wherein the regulated voltage has a maximum value higher than the first positive power supply voltage.

5. The integrated circuit structure of claim 1 further comprising:
    an I/O power supply source;
    a voltage down converter (VDC) coupled between the negative-voltage generator and the I/O power supply source, wherein the VDC is configured to convert a voltage received from the I/O power supply source to the second positive power supply voltage; and a core power supply source coupled to the SRAM cell and configured to provide the first positive power supply voltage.

6. An integrated circuit structure comprising:
a negative-voltage node;
a capacitor comprising a first capacitor plate connected to the negative-voltage node;
an inverter comprising:
  a first output node coupled to a second capacitor plate of the capacitor; and
  a first power-receiving node;
a supply voltage regulator comprising:
  a second output node coupled to the first power-receiving node;
  an input node receiving an input signal having a first maximum positive voltage, wherein the supply voltage regulator is configured to convert the input signal to a regulated voltage, and wherein the regulated voltage increases in response to a decrease in the first maximum positive voltage, and decreases in response to an increase in the first maximum positive voltage; and
  a second power-receiving node; and
a high-voltage power source coupled to the second power-receiving node, wherein the high-voltage power source is configured to supply a high voltage higher than the first maximum positive voltage.

7. The integrated circuit structure of claim 6, wherein the supply voltage regulator is configured so that a maximum positive value of the regulated voltage is higher than the first maximum positive voltage of the input signal.

8. The integrated circuit structure of claim 6 further comprising:
a static random access memory (SRAM) cell;
a first power supply node connected to the SRAM cell, wherein the first power supply node is configured to supply the first maximum positive voltage to the SRAM cell; and
a bit-line connected to the SRAM cell and coupled to the negative-voltage node.

9. The integrated circuit structure of claim 8 further comprising a word-line connected to the SRAM cell and the input node of the supply voltage regulator.

10. The integrated circuit structure of claim 6 further comprising:
a switch coupled between the negative-voltage node and an electrical ground, wherein the switch is configured to connect the negative-voltage node to the electrical ground and disconnect the negative-voltage node from the electrical ground in response to a signal at an input of the inverter.

11. The integrated circuit structure of claim 6 further comprising an additional inverter coupled to the high-voltage power source, wherein the additional inverter comprises an output coupled to an input of the inverter.

12. The integrated circuit structure of claim 6, wherein the high voltage supplied by the high-voltage power source is independent from a variation in the first maximum positive voltage of the input signal.

13. The integrated circuit structure of claim 6 further comprising a signal source coupled to the input node of the supply voltage regulator, wherein the signal source is configured to output the input signal varying between the first maximum positive voltage and an electrical ground.

14. An integrated circuit structure comprising:
a static random access memory (SRAM) cell;
a first power supply node connected to the SRAM cell, wherein the first power supply node is configured to supply a first positive power supply voltage to the SRAM cell;
a bit-line connected to the SRAM cell;
a capacitor comprising a first capacitor plate coupled to the bit-line;
a first inverter comprising:
  a first output coupled to a second capacitor plate of the capacitor; and
  a first power-receiving node; and
a supply voltage regulator comprising:
  a second inverter comprising:
    a second output node coupled to the first power-receiving node and outputs a regulated voltage; and
    a second power-receiving node configured to receive a high supply voltage higher than the first positive power supply voltage.

15. The integrated circuit structure of claim 14 further comprising:
a high-voltage power source coupled to the second power-receiving node and configured to provide the high supply voltage to the second power-receiving node; and
a core power source coupled to the first power supply node and configured to provide the first positive power supply voltage.

16. The integrated circuit structure of claim 15, wherein the high-voltage power source and the supply voltage regulator are configured so that the supply voltage regulator outputs a first voltage when the first power supply voltage is at a first value, and outputs a second voltage higher than the first value when the first power supply voltage is at a second value lower than the first value.

17. The integrated circuit structure of claim 14, wherein the second inverter further comprises an input node, and wherein the integrated circuit structure further comprises a signal source coupled to the input node of the second inverter, and configured to provide a signal varying between the first positive power supply voltage and an electrical ground to the input node of the second inverter.

18. The integrated circuit structure of claim 17 further comprising a word-line connected to the SRAM cell and the input node of the second inverter.

* * * * *